United States Patent
Shimizu

(10) Patent No.: US 9,583,582 B2
(45) Date of Patent: Feb. 28, 2017

(54) SEMICONDUCTOR INTEGRATED DEVICE

(71) Applicant: Kabushiki Kaisha Toshiba, Minato-ku (JP)

(72) Inventor: Yuui Shimizu, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 3 days.

(21) Appl. No.: 14/478,315

(22) Filed: Sep. 5, 2014

(65) Prior Publication Data
US 2015/0256158 A1    Sep. 10, 2015

Related U.S. Application Data

(60) Provisional application No. 61/950,453, filed on Mar. 10, 2014.

(51) Int. Cl.
*H03B 1/00* (2006.01)
*H03K 3/00* (2006.01)
*H01L 29/423* (2006.01)
*H03K 19/0185* (2006.01)

(52) U.S. Cl.
CPC ......... *H01L 29/42372* (2013.01); *H03K 19/018571* (2013.01)

(58) Field of Classification Search
USPC ..... 327/108–112, 379, 389, 391; 326/22–27, 326/81–87
See application file for complete search history.

(56) References Cited

U.S. PATENT DOCUMENTS

| 4,719,369 | A | * | 1/1988 | Asano | G05F 3/24 326/121 |
| 5,994,921 | A | * | 11/1999 | Hedberg | H03K 17/0416 326/80 |
| 6,034,563 | A | * | 3/2000 | Mashiko | H01L 27/0218 327/377 |
| 6,229,365 | B1 | * | 5/2001 | Iketani | G11C 7/1078 326/81 |
| 6,265,892 | B1 | | 7/2001 | Jou et al. | |

(Continued)

FOREIGN PATENT DOCUMENTS

TW           494569 B     7/2002

OTHER PUBLICATIONS

Chulbum Kim, et al., "A 21nm High Performance 64Gb MLC NAND Flash Memory with 400MB/s Asynchronous Toggle DDR Interface" Symposium on VLSI Circuits Digest of Technical Papers, 2011, pp. 196-197.

(Continued)

*Primary Examiner* — Brandon S Cole
(74) *Attorney, Agent, or Firm* — Oblon, McClelland, Maier & Neustadt, L.L.P.

(57) ABSTRACT

According to one embodiment, a semiconductor integrated device includes a first node that receives a first voltage, a second node that receives a second voltage, and an electrode. A PMOS transistor is coupled between the first node and the electrode. An NMOS transistor is coupled between the second node and the electrode. A control signal at a voltage lower than the second voltage is supplied to a gate electrode of the PMOS transistor. A control signal at a voltage higher than the first voltage is supplied to a gate electrode of the NMOS transistor.

8 Claims, 6 Drawing Sheets

(56) References Cited

U.S. PATENT DOCUMENTS

| | | | | |
|---|---|---|---|---|
| 6,307,791 B1* | 10/2001 | Otsuka | ............... | G11C 7/1051 |
| | | | | 326/30 |
| 6,320,433 B1* | 11/2001 | Hinterscher | ......... | H03K 17/164 |
| | | | | 326/27 |
| 6,693,842 B2* | 2/2004 | Chung | ............... | G11C 7/1051 |
| | | | | 327/108 |
| 6,750,680 B2* | 6/2004 | Zama | ............... | H03K 19/01707 |
| | | | | 326/121 |
| 6,919,738 B2* | 7/2005 | Kushida | ............ | H03K 19/0005 |
| | | | | 326/30 |
| 7,667,485 B2* | 2/2010 | Sakata | .................. | G11C 5/147 |
| | | | | 326/21 |
| 8,471,591 B2 | 6/2013 | Gillingham | | |
| 8,508,251 B2 | 8/2013 | Choi et al. | | |
| 2004/0008054 A1* | 1/2004 | Lesea | ............... | H04L 25/0278 |
| | | | | 326/30 |
| 2004/0141391 A1* | 7/2004 | Lee | .................... | G11C 7/1051 |
| | | | | 365/200 |
| 2006/0017457 A1 | 1/2006 | Pan et al. | | |
| 2006/0220676 A1* | 10/2006 | Kanazawa | ......... | H03K 19/0016 |
| | | | | 326/33 |
| 2006/0226868 A1* | 10/2006 | Lee | .................. | H03K 19/0005 |
| | | | | 326/30 |
| 2013/0241620 A1 | 9/2013 | Suzuki et al. | | |

OTHER PUBLICATIONS

Office Action issued Nov. 20, 2015 in Taiwanese Patent Application No. 103115067 (with English language translation).
Taiwan Office Action issued Apr. 18, 2016 in Taiwanese Application No. 103115067 with English translation, 14 pages.

* cited by examiner

SEMICONDUCTOR INTEGRATED DEVICE

CROSS-REFERENCE TO RELATED APPLICATIONS

This application is based upon and claims the benefit of priority from U.S. Provisional Application No. 61/950,453, filed on Mar. 10, 2014; the entire contents of which are incorporated herein by reference.

FIELD

Embodiments described herein relate generally to a semiconductor integrated device.

BACKGROUND

In association with the increase in operation speed of semiconductor integrated devices, a problem of signal reflection sometimes occurs due to mismatching of the impedance between semiconductor integrated devices. To solve this problem of the signal reflection, a known structure includes an impedance adjustment circuit called an on-die termination (ODT) circuit around the electrode of the semiconductor integrated device.

To reduce the distortion of the signal transmitted via the electrode, the ODT circuit is preferred to have linearity. Additionally, it is necessary to reduce the increase in pin capacitance due to disposing the ODT circuit.

DETAILED DESCRIPTION

In general, according to one embodiment, a semiconductor integrated device includes a first node configured to receive a first voltage, a second node configured to receive a second voltage, an electrode, a first PMOS transistor having a source-drain path coupled between the first node and the electrode, a first NMOS transistor having a source-drain path coupled between the second node and the electrode, and a control circuit configured to supply respective control signals to a gate electrode of the first PMOS transistor and a gate electrode of the first NMOS transistor. The semiconductor integrated device, in which the control circuit supplies a control signal at a third voltage lower than the second voltage to the gate electrode of the first PMOS transistor when turning on the first PMOS transistor, and supplies a control signal at a fourth voltage higher than the first voltage to the gate electrode of the first NMOS transistor when turning on the first NMOS transistor, is provided.

Exemplary embodiments of a semiconductor integrated device will be explained below in detail with reference to the accompanying drawings. The present invention is not limited to the following embodiments.

(First Embodiment)

Figure 1:
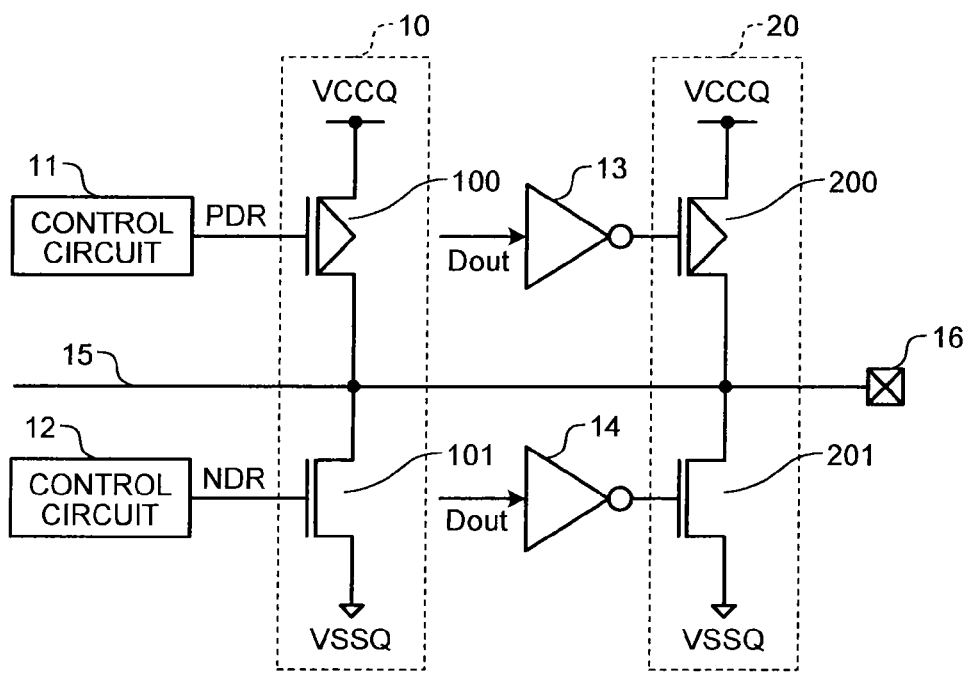
FIG. 1 is a diagram illustrating a semiconductor integrated device of a first embodiment.

FIG. 1 is a diagram illustrating a semiconductor integrated device of a first embodiment. The semiconductor integrated device of this embodiment includes an ODT circuit 10. The ODT circuit 10 includes a first PMOS transistor 100 and a first NMOS transistor 101. In the first PMOS transistor 100, a first power supply voltage VCCQ is applied to the source electrode while a signal line 15 is coupled to the drain electrode. In the first NMOS transistor 101, the drain electrode is coupled to the signal line 15 while a second power supply voltage VSSQ at the ground potential is applied to the source electrode. To the gate electrode of the first PMOS transistor 100, a control signal PDR is supplied from a control circuit 11. To the gate electrode of the first NMOS transistor 101, a control signal NDR is supplied from a control circuit 12. The control signal PDR and the control signal NDR will be described later.

This embodiment includes an output buffer 20. The output buffer 20 is hereinafter described as an off-chip driver (OCD) 20. The OCD 20 includes a second PMOS transistor 200 and a second NMOS transistor 201. In the second PMOS transistor, the first power supply voltage VCCQ is supplied to the source electrode while the drain electrode is coupled to the signal line 15. The signal line 15 is coupled to an electrode 16. The electrode 16 is, for example, an input/output pad to which an output signal from the semiconductor integrated device and a signal from outside are supplied. In the second NMOS transistor 201, the drain electrode is coupled to the signal line 15 while the second power supply voltage VSSQ at the ground potential is supplied to the source electrode.

To the gate electrode of the second PMOS transistor 200, the output signal of a pre-driver 13 is supplied. To the pre-driver 13, a signal Dout is supplied. The signal Dout is supplied from an internal circuit (not illustrated) of the semiconductor integrated device. The signal Dout is inverted by the pre-driver 13 and then supplied to the gate electrode of the second PMOS transistor 200. To the gate electrode of the second NMOS transistor 201, the output signal of a pre-driver 14 is supplied. To the pre-driver 14, the described signal Dout is supplied. The signal Dout is inverted by the pre-driver 14 and then supplied to the gate electrode of the second NMOS transistor 201. The signal Dout is, for example, the output signal from an internal circuit (not illustrated).

The control signal PDR to be supplied to the gate electrode of the first PMOS transistor 100 in the ODT circuit 10 is, for example, set as follows. In the case where the ODT circuit 10 is used to adjust the resistance value, the control signal PDR to be supplied to the gate electrode of the first PMOS transistor 100 from the control circuit 11 is set to a voltage VL lower than the second power supply voltage VSSQ. This allows the first PMOS transistor 100 to operate in the linear region. The control signal NDR to be supplied to the gate electrode of the first NMOS transistor 101 from the control circuit 12 is set to a voltage VH higher than the first power supply voltage VCCQ. Supplying the voltage VH allows the first NMOS transistor 101 to operate in the linear region.

The voltage VH higher than the first power supply voltage VCCQ is, for example, generated from the first power supply voltage VCCQ using a high-voltage generation circuit (not illustrated). For example, a pump circuit is used as the high-voltage generation circuit. For a NAND-type flash memory or similar device, the first power supply voltage VCCQ is converted to generate, for example, a program voltage VPRGM used when data is written to the memory device. This program voltage VPRGM can be supplied to the gate electrode of the first NMOS transistor 101 via the control circuit 12.

As the voltage VL lower than the second power supply voltage VSSQ at the ground potential, the voltage generated by a negative-voltage generation circuit (not illustrated) can be supplied to the gate electrode of the first PMOS transistor 100 via the control circuit 12.

In a state where the ODT circuit 10 is not used, for example, the first power supply voltage VCCQ is applied to the gate electrode of the first PMOS transistor 100 from the control circuit 11. Accordingly, the first PMOS transistor 100 is turned off. To the gate electrode of the first NMOS transistor 101, for example, the second power supply voltage VSSQ is applied from the control circuit 12. Accordingly, the first NMOS transistor 101 is turned off.

Figure 2:
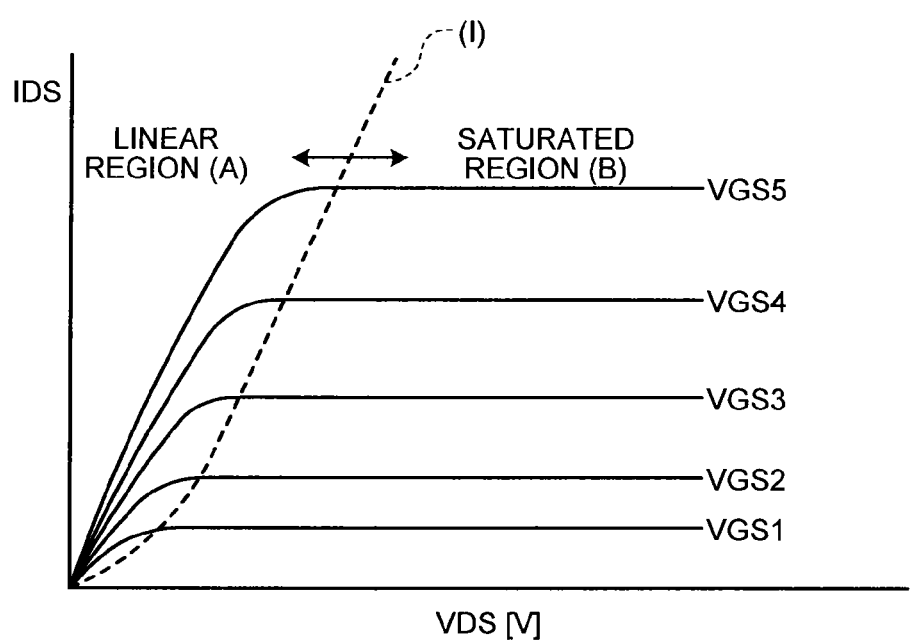
FIG. 2 is a graph for describing characteristics of a MOS transistor.

FIG. 2 is a graph for describing the characteristics of the MOS transistor. The horizontal axis denotes a source-drain voltage VDS of the MOS transistor while the vertical axis denotes a drain current IDS. The dashed line (I) illustrates a pinch-off curve. As generally known, the MOS transistor has a linear region (A) illustrated on the left side of the pinch-off curve (I) and a saturated region (B) illustrated on the right side of the pinch-off curve. When the gate voltage to be supplied to the gate electrode is increased (in contrast, decreased for the PMOS transistor) to increase a gate-source voltage VGS with respect to the source-drain voltage VDS, the linear region (A) expands. In FIG. 2, the gate-source voltage becomes higher from VGS1 to VGS5.

The relationship between the source-drain voltage VDS, the gate-source voltage VGS, and a threshold voltage Vth on the pinch-off curve (I) can be expressed by the formula (1).

$$VDS=VGS-Vth \quad (1)$$

The formula (1) can be rewritten as the following formula (2).

$$VGS=VDS+Vth \quad (2)$$

Accordingly, setting the gate-source voltage VGS to the voltage higher than the voltage obtained by adding the threshold voltage Vth to the source-drain voltage VDS allows the MOS transistor to operate in the linear region (A).

As described in FIG. 1, the control signal PDR to be supplied to the gate electrode of the first PMOS transistor 100 is set to the voltage VL lower than the second power supply voltage VSSQ at the ground potential. This increases the gate-source voltage VGS of the first PMOS transistor 100 so as to expand the linear region (A). Accordingly, for example, even when the electric potential of the signal line 15 changes, the first PMOS transistor 100 can operate in the linear region (A). Similarly, setting the control signal NDR to be supplied to the gate electrode of the first NMOS transistor 101 to the voltage VH higher than the first power supply voltage VCCQ increases the gate-source voltage VGS of the first NMOS transistor 101, thus expanding the linear region (A). Accordingly, for example, even when the electric potential of the signal line 15 changes, the first NMOS transistor 101 can operate in the linear region (A).

With the first embodiment, the control signals (PDR and NDR) from the control circuits (11 and 12) allow the ODT circuit 10 to operate in the linear region (A). This allows reducing the distortion of the signal transmitted and received via the electrode 16. Additionally, for example, for the semiconductor integrated device with a NAND-type flash memory, the control signal NDR to be supplied to the gate electrode of the first NMOS transistor 101 in the ODT circuit 10 can employ the voltage from the voltage generation circuit included in the semiconductor integrated device as it is. Thus, there is no need to additionally dispose a circuit for boosting the power supply voltage.

(Second Embodiment)

Figure 3:
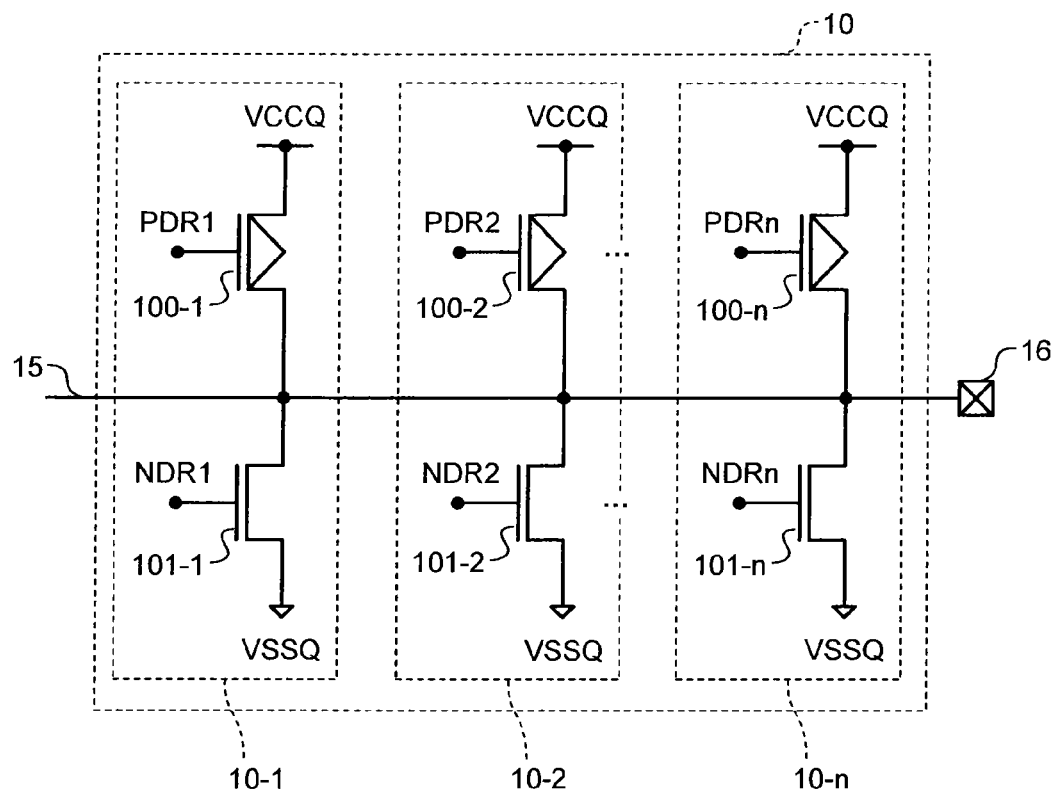
FIG. 3 is a diagram illustrating an ODT circuit of a second embodiment.

FIG. 3 is a diagram illustrating an ODT circuit of a second embodiment. Like reference numerals designate corresponding elements to those of the above-described embodiment, and redundant descriptions will be made only when necessary. The ODT circuit 10 of this embodiment includes ODT component circuits (10-1 to 10-$n$). The ODT component circuits (10-1 to 10-$n$) include respective PMOS transistors (100-1 to 100-$n$) and NMOS transistors (101-1 to 101-$n$). To the gate electrodes of the PMOS transistors (100-1 to 100-$n$), respective control signals (PDR1 to PDRn) are supplied from the control circuit 11. To the gate electrodes of the NMOS transistors (101-1 to 101-$n$), respective control signals (NDR1 to NDRn) are supplied from the control circuit 12.

For example, the gate widths of the PMOS transistors (100-1 to 100-$n$) are adjusted by a predetermined ratio. For example, the PMOS transistor 100-2 has a gate width twice as large as the gate width of the PMOS transistor 100-1. The PMOS transistor 100-$n$ has a gate width $2^n$ times as large as the gate width of the PMOS transistor 100-1. That is, the PMOS transistors (100-1 to 100-$n$) have respective gate widths set at a ratio using the multiplier of two. This allows setting the resistance values of the PMOS transistors (100-1 to 100-$n$) to respective values proportional to the reciprocal of the ratio. Similarly, for example, the gate widths of the NMOS transistors (101-1 to 101-$n$) are adjusted by a predetermined ratio. For example, the NMOS transistor 101-2 has a gate width twice as large as the gate width of the NMOS transistor 101-1. The NMOS transistor 101-$n$ has a gate width $2^n$ times as large as the gate width of the NMOS transistor 101-1. This allows setting the resistance value of the NMOS transistors (101-1 to 101-$n$) to respective values proportional to the reciprocal of the ratio.

The PMOS transistors to be operated are selected by the control signals (PDR1 to PDRn) from the control circuit 11. Similarly, the NMOS transistors to be operated are selected by the control signals (NDR1 to NDRn) from the control circuit 12. Selecting the PMOS transistors and the NMOS transistor to be turned on appropriately allows adjusting the resistance value of the ODT circuit 10. Additionally, the gate widths of the MOS transistors constituting the ODT component circuit are set at a predetermined ratio so as to adjust the respective resistance values of the MOS transistors. This increases the variety of the combinations of the resistance values, thus facilitating the adjustment of the resistance value. For example, in the case where three MOS transistors each having the same gate width and the resistance value of 1 ohm (Ω) are used and then any of these MOS transistors is turned on, the resistance values allow three combinations of 1Ω, 2Ω (=1+1), and 3Ω (=1+1+1). In contrast, in the case where the gate widths are adjusted by the ratio using the multiplier of two to prepare MOS transistors having respective resistance values of 1Ω, 2Ω, and 4Ω and then any of these MOS transistors is turned on, the resistance values allow seven combinations of 1Ω, 2Ω, 3Ω (=1Ω+2Ω), 4Ω, 5Ω (=1Ω+4Ω), 6Ω (=2Ω+4Ω), and 7Ω (=1Ω+2Ω+4Ω). Here, the predetermined ratio is not limited to the multiplier of two.

With this embodiment, the ODT circuit is constituted by the plurality of ODT component circuits (10-1 to 10-$n$) to control the electrical conduction in the respective ODT component circuits. This allows adjusting the resistance value of the ODT circuit. Additionally, the respective sizes, for example, the gate widths of the MOS transistors constituting the ODT component circuit are set at the predetermined ratio so as to adjust the resistance values. This allows expanding the variety of the combinations of the resistance values.

(Third Embodiment)

Figure 4:
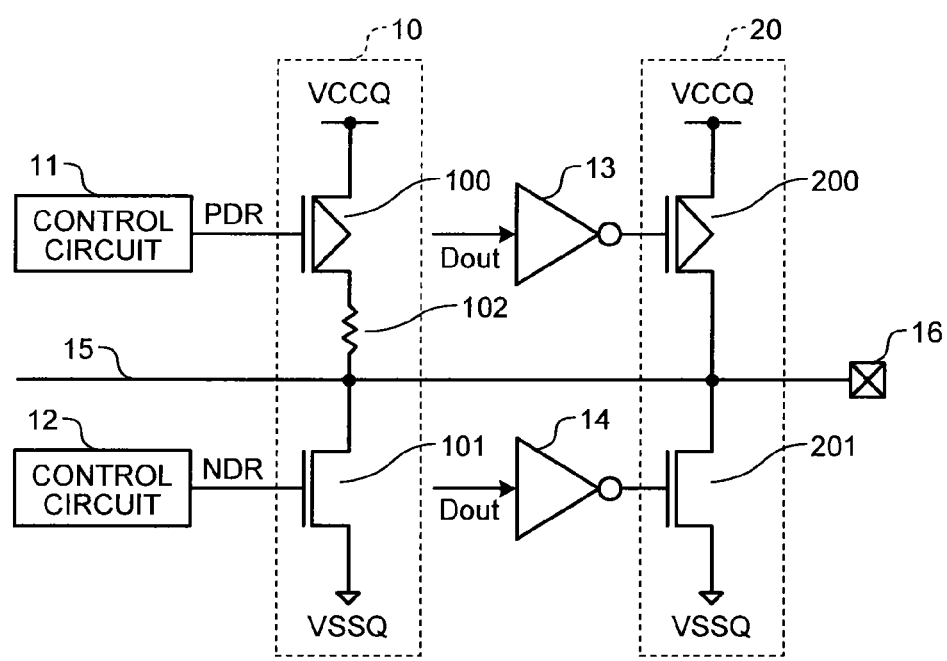
FIG. 4 is a diagram illustrating a semiconductor integrated device of a third embodiment.

FIG. 4 is a diagram illustrating a semiconductor integrated device of a third embodiment. Like reference numerals designate corresponding elements to those of the above-described embodiment, and redundant descriptions will be made only when necessary. The ODT circuit 10 of this embodiment includes a resistor 102 between the drain electrode of the first PMOS transistor 100 and the signal line 15. The resistor 102 is realized by, for example, bypassing the wiring to a wiring layer that employs a conductive material (such as polysilicon) having a resistivity higher than the resistivity of the conducting layer (such as aluminum, copper, and tungsten) that forms the electrode 16 and the signal line 15. Alternatively, the resistor 102 can be realized by using a MOS transistor, by locally shortening the wire width, or by ensuring a longer wire length for bypassing. Disposing the resistor 102 having the linearity allows maintaining the total linearity by the first PMOS transistor 100 and the resistor 102 even in the case where the linearity of the resistance by the first PMOS transistor 100 is low. Accordingly, for example, the control signal PDR for turning on the first PMOS transistor 100 can be set to the second power supply voltage VSSQ instead of being set to the voltage lower than the second power supply voltage VSSQ at the ground potential. This eliminates the need for disposing an additional voltage generation circuit for generating a negative voltage.

Here, the ratio of the respective resistances of the resistor 102 and the first PMOS transistor 100 can be appropriately set. For example, the configuration where a resistance of 300 ohms (Ω) is set by the PMOS transistor 100 alone can be changed to a configuration where the resistance value of the resistor 102 is set to 200Ω so as to set the resistance value by the PMOS transistor 100 to 100Ω.

Compared with the case where the resistance of 300Ω is formed by the resistance value of the first PMOS transistor 100 alone, for the configuration with the resistor 102, the resistance value of the first PMOS transistor 100 is set to 100Ω that is decreased by the resistance value corresponding to the resistor 102. For example, expanding the gate width of the first PMOS transistor 100 can ensure the configuration the PMOS transistor with the small resistance value. An increase in gate width causes an increase in pin capacitance. In this embodiment, the first NMOS transistor 101 side of the ODT circuit 10 is constituted by the first NMOS transistor 101 alone. Accordingly, this configuration has a larger resistance value of the first NMOS transistor 101 compared with the configuration with the resistor, thus having a narrower gate width of the first NMOS transistor 101. This allows reducing the increase in pin capacitance. Supplying the control signal at the voltage VH higher than the first power supply voltage VCCQ to the gate electrode of the first NMOS transistor 101 allows the first NMOS transistor 101 to operate in the linear region.

(Fourth Embodiment)

Figure 5:
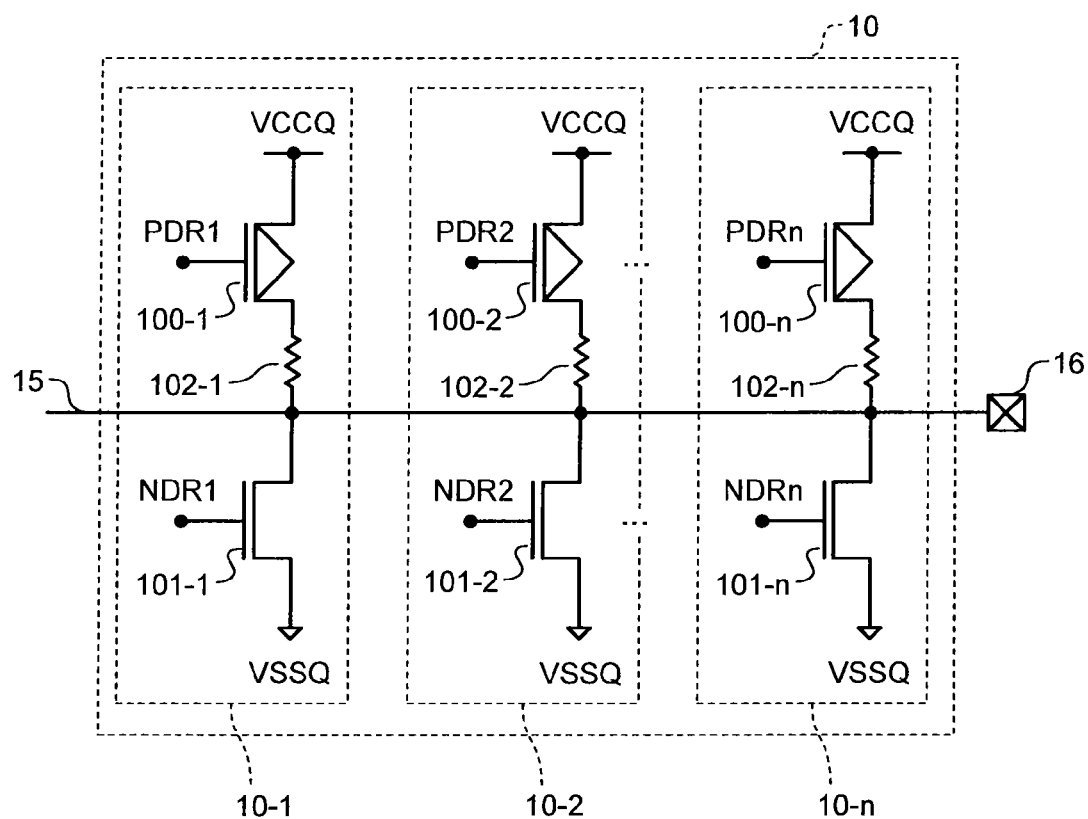
FIG. 5 is a diagram illustrating an ODT circuit of a fourth embodiment.

FIG. 5 is a diagram illustrating an ODT circuit of a fourth embodiment. Like reference numerals designate corresponding elements to those of the above-described embodiment, and redundant descriptions will be made only when necessary. The ODT circuit 10 of this embodiment includes the ODT component circuits (10-1 to 10-$n$). The ODT component circuits (10-1 to 10-$n$) include respective PMOS transistors (100-1 to 100-$n$) and NMOS transistors (101-1 to 101-$n$). To the gate electrodes of the PMOS transistors (100-1 to 100-$n$), the respective control signals (PDR1 to PDRn) are supplied from the control circuit 11. To the gate electrodes of the NMOS transistors (101-1 to 101-$n$), the respective control signals (NDR1 to NDRn) are supplied from the control circuit 12. Between the respective drain electrodes of the PMOS transistors (100-1 to 100-$n$) and the signal line 15, resistors (102-1 to 102-$n$) are coupled.

For example, the gate widths of the PMOS transistors (100-1 to 100-$n$) are adjusted by a predetermined ratio. For example, the PMOS transistor 100-1 has a gate width twice as large as the gate width of the PMOS transistor 100-1. The PMOS transistor 100-$n$ has a gate width $2^n$ times as large as the gate width of the PMOS transistor 100-1. That is, the gate widths have the ratio using the multiplier of two. This allows setting the resistance values of the PMOS transistors (100-1 to 100-$n$) to respective values proportional to the reciprocal of the ratio.

Similarly, the values of the resistors (102-1 to 102-$n$) coupled to the respective drain electrodes of the PMOS transistors (100-1 to 100-$n$) are also adjusted by a predetermined ratio. For example, the resistor 102-2 can be set to be a half of the resistor 102-1. The resistor 102-$n$ can be set to be $\frac{1}{2}^n$ times as large as the resistor 102-1.

Similarly, for example, the gate widths of the NMOS transistors (101-1 to 101-$n$) are adjusted by a predetermined ratio. For example, the NMOS transistor 101-2 has a gate width twice as large as the gate width of the NMOS transistor 101-1. The NMOS transistor 101-$n$ has a gate width $2^n$ times as large as the gate width of the NMOS transistor 101-1. This allows setting the resistance values of the NMOS transistors (101-1 to 101-$n$) to respective values proportional to the reciprocal of the ratio.

The PMOS transistors to be turned on are selected by the control signals (PDR1 to PDRn) from the control circuit 11. Similarly, the NMOS transistors to be turned on are selected by the control signals (NDR1 to NDRn) from the control circuit 12. Selecting the PMOS transistors (100-1 to 100-$n$) and the NMOS transistors (101-1 to 101-$n$) to be turned on appropriately allows adjusting the resistance value of the ODT circuit 10. Additionally, the gate widths of the MOS transistors constituting the ODT component circuit are set at a predetermined ratio so as to adjust the respective resistance values of the MOS transistors. This increases the variety of the combinations of the resistance values, thus facilitating the adjustment of the resistance value.

With this embodiment, the ODT circuit is constituted by the plurality of ODT component circuits (10-1 to 10-$n$) to control the electrical conduction in the respective ODT component circuits. This allows adjusting the resistance value of the ODT circuit. Additionally, the sizes of the transistors constituting the respective ODT component circuits are adjusted by the predetermined ratio. This allows expanding the variety of adjustments for the resistance value. Additionally, adjusting the values of the resistors to be coupled to the respective drain electrodes of the PMOS transistors (100-1 to 100-$n$) by the predetermined ratio allows further expanding the variety of adjustments for the resistance value.

(Fifth Embodiment)

Figure 6:
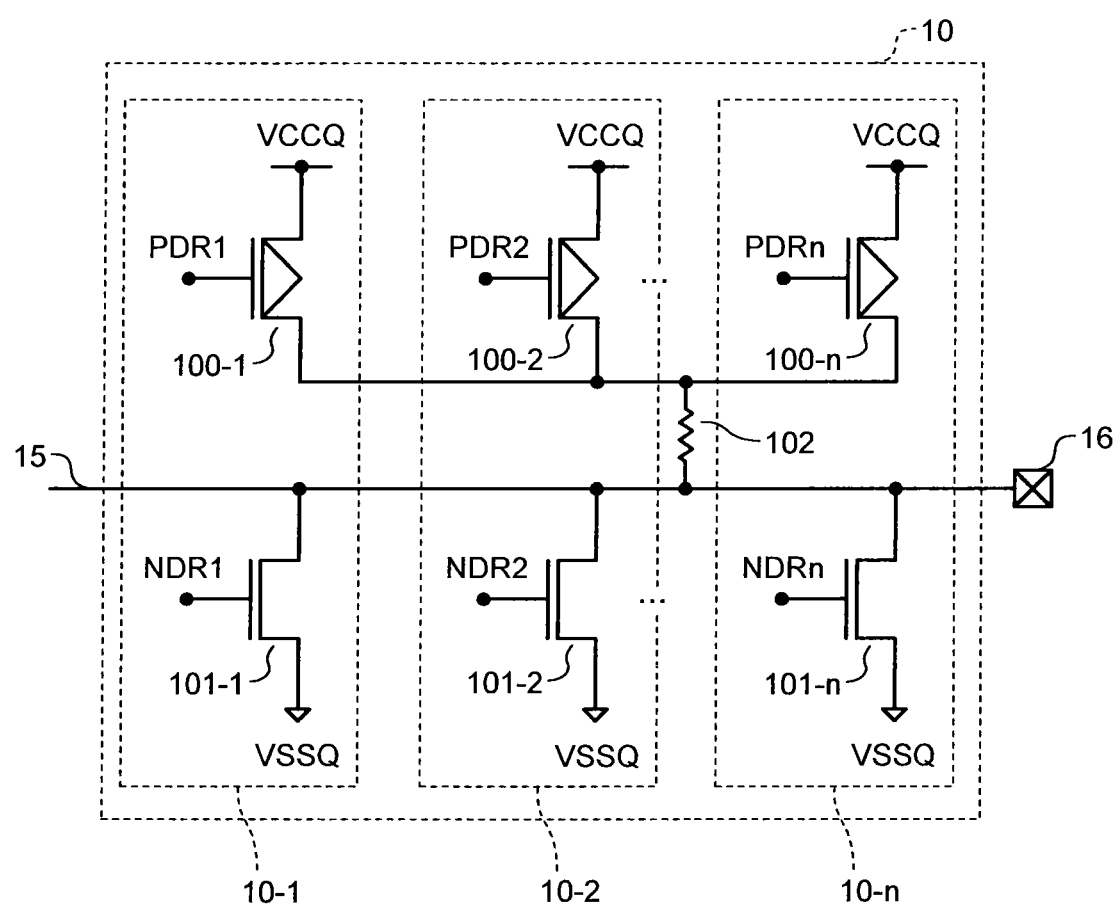
FIG. 6 is a diagram illustrating an ODT circuit of a fifth embodiment.

FIG. 6 is a diagram illustrating an ODT circuit of a fifth embodiment. Like reference numerals designate corresponding elements to those of the above-described embodiment, and redundant descriptions will be made only when necessary. In the ODT circuit 10 in this embodiment, the drain electrodes of the PMOS transistors (100-1 to 100-$n$) constituting the ODT component circuits (10-1 to 10-$n$) are coupled to the signal line 15 via the common resistor 102.

Under control by the control signals (PDR1 to PDRn) supplied from the control circuit 11, the PMOS transistors (100-1 to 100-$n$) to be turned on are selected. Selecting the PMOS transistors to be turned on appropriately allows adjusting the resistance value between the resistor 102 and the first power supply voltage VCCQ. That is, selecting the PMOS transistors to be turned on from the PMOS transistors (100-1 to 100-$n$) appropriately allows adjusting the resistance value. Also in this embodiment, for example, the gate widths of the PMOS transistors (100-1 to 100-$n$) are adjusted by the ratio using the multiplier of two. Changing the combination of the PMOS transistors (100-1 to 100-$n$) to be turned on appropriately allows adjusting the resistance value.

With this embodiment, appropriately selecting the PMOS transistors (100-1 to 100-$n$) coupled to the common resistor 102 to be turned on allows adjusting the resistance value. Additionally, the resistor 102 has the linearity. Accordingly, increasing the ratio of the resistance value by the resistor 102 allows reducing the linearity of the resistor by the PMOS transistors (100-1 to 100-$n$). Thus, for example, the following configuration is possible. When the PMOS transistors (100-1 to 100-$n$) are turned on, the second power supply voltage VSSQ at the ground potential is used as the control signals (PDR1 to PDRn) supplied from the control circuit 11. In this case, there is no need to additionally dispose a circuit for generating a negative power supply voltage. Additionally, the PMOS transistors (100-1 to 100-$n$) are coupled to the electrode 16 via the resistor 102. This allows reducing the increase in pin capacitance due to the PMOS transistors (100-1 to 100-$n$).

(Sixth Embodiment)

Figure 7:
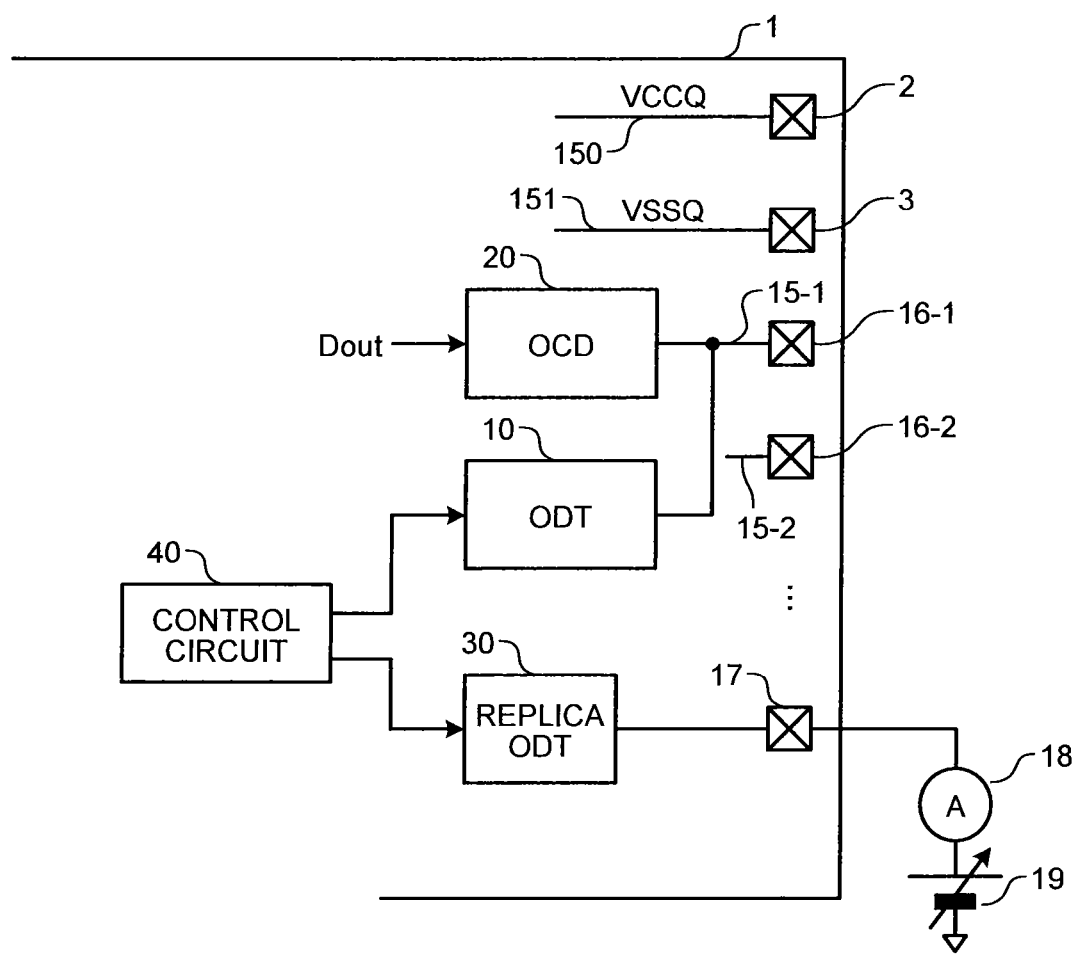
FIG. 7 is a diagram illustrating a semiconductor integrated device of a sixth embodiment.

FIG. 7 is a diagram illustrating a semiconductor integrated device of a sixth embodiment. Like reference numerals designate corresponding elements to those of the above-described embodiment, and redundant descriptions will be made only when necessary. The semiconductor integrated device of this embodiment includes a plurality of electrodes (2, 3, 16-1, 16-2, and 17) formed on a semiconductor substrate 1. The electrode 2 is connected to a power supply line 150 supplying the first power supply voltage VCCQ. The electrode 3 is connected to a power supply line 151 supplying the second power supply voltage VSSQ at the ground potential.

For example, the electrode 16-1 and the electrode 16-2 are input/output electrodes for transmitting and receiving signals. The electrode 16-1 is connected to the OCD 20. The signal Dout is supplied to the OCD 20. The output signal of the OCD 20 is supplied to the electrode 16-1 via a signal line 15-1. The electrode 16-1 constitutes the input/output electrode for transmitting and receiving signals and thus includes an input buffer circuit for receiving a signal supplied from outside of the semiconductor substrate 1 to the electrode 16-1 and similar circuit. Here, these circuits are omitted. The same applies to the electrode 16-2. The electrode 16-2 is connected to a signal line 15-2.

The signal line 15-1 is connected to the ODT circuit 10. The ODT circuit 10 can employ the ODT circuit in any of the embodiments described above. The electrode 17 is connected to a replica ODT circuit 30. The replica ODT circuit 30 has the same configuration as that of the ODT circuit 10. For example, the size of the MOS transistor constituting the replica ODT circuit 30 is a size shrunk by a predetermined ratio with respect to the MOS transistor constituting the ODT circuit 10. The ODT circuit 10 and the replica ODT circuit 30 receive control signals supplied from a control circuit 40.

For example, the semiconductor integrated device of this embodiment can adjust the resistance value of the ODT circuit 10 using the replica ODT circuit 30. Specifically, for example, the electrode 17 is connected to an ammeter 18 and a variable voltage source 19. Under control by the control circuit 40, the PMOS transistors and the NMOS transistors constituting the replica ODT circuit 30 are selectively turned on. Reproducing the combination of the PMOS transistors (not illustrated) and the NMOS transistors (not illustrated) with a desired resistance value using the replica ODT circuit 30 allows adjusting the resistance value of the ODT circuit 10. In addition to the electrode 16-1, in the case where the electrode 16-2 is connected to another ODT circuit 10 with a similar configuration, the replica ODT circuit 30 is used to adjust the resistance value and the result is used for adjustment of the respective ODT circuits 10. This allows efficiently adjusting the resistance values of the ODT circuits 10.

(Seventh Embodiment)

Figure 8:
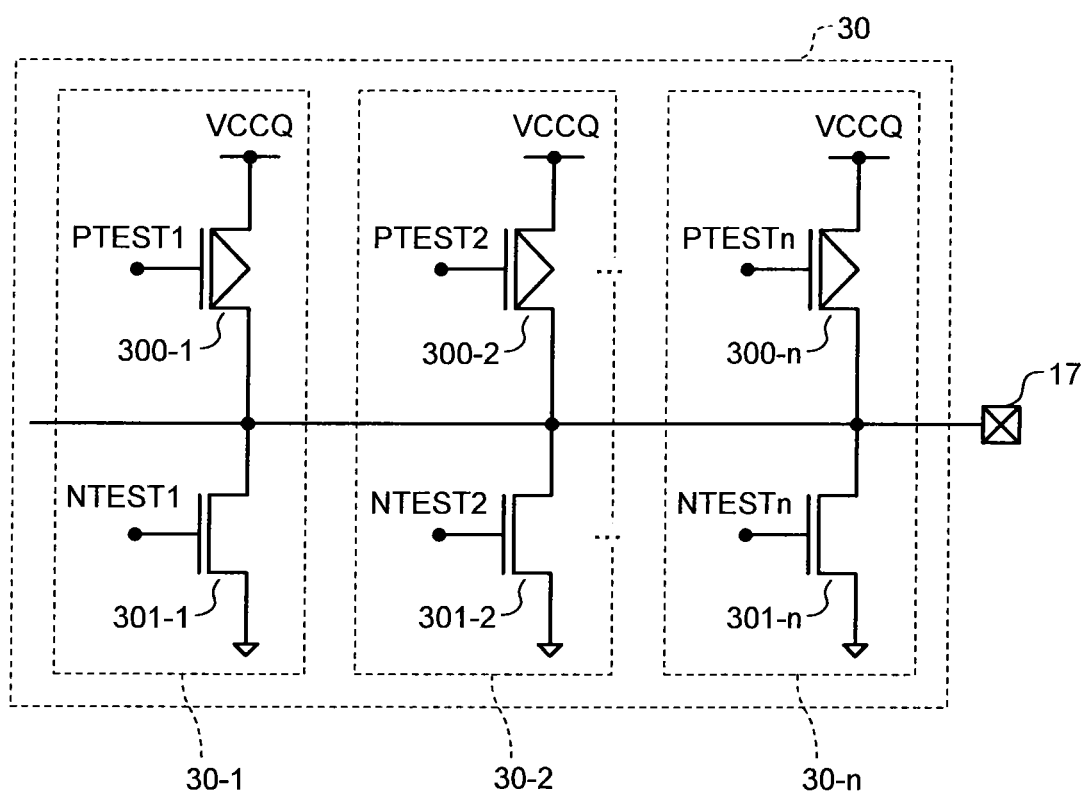
FIG. 8 is a diagram illustrating a replica circuit of an ODT circuit of a seventh embodiment.

FIG. 8 is a diagram illustrating a replica ODT circuit 30 of a seventh embodiment. Like reference numerals designate corresponding elements to those of the above-described embodiment, and redundant descriptions will be made only when necessary. The replica ODT circuit 30 in this embodiment has the configuration of a replica circuit of the ODT circuit 10 illustrated in FIG. 3. The replica ODT circuit 30 includes a plurality of replica ODT component circuits (30-1 to 30-$n$). The replica ODT component circuits (30-1 to 30-$n$) include respective PMOS transistors (300-1 to 300-$n$) and NMOS transistors (301-1 to 301-$n$). The number of stages of the replica ODT component circuits (30-1 to 30-$n$) is the same as the number of stages of the ODT component circuits (10-1 to 10-$n$).

The PMOS transistors (300-1 to 300-$n$) of the replica ODT component circuits (30-1 to 30-$n$) have respective sizes obtained by shrinking the sizes of the PMOS transistors (100-1 to 100-$n$) of the ODT component circuits (10-1 to 10-$n$) by a predetermined ratio. Similarly, the NMOS transistors (301-1 to 301-$n$) of the replica ODT component circuits (30-1 to 30-$n$) have respective sizes obtained by shrinking the sizes of the NMOS transistors (101-1 to 101-$n$) of the ODT component circuits (10-1 to 10-$n$) by a predetermined ratio. Shrinking the size by the predetermined ratio allows forming the replica ODT circuit 30 in a small area on the semiconductor substrate 1.

For example, in the case where the resistance value by the NMOS transistors (301-1 to 301-$n$) constituting the replica ODT circuit 30 is measured, the respective PMOS transistors (300-1 to 300-$n$) of the replica ODT component circuits (30-1 to 30-$n$) are turned off by control signals (PTEST1 to PTESTn) from the control circuit 40. On the other hand, the respective NMOS transistors (301-1 to 301-$n$) of the replica ODT component circuits (30-1 to 30-$n$) are selectively turned on by control signals (NTEST1 to NTESTn) from the control circuit 40. In this state, a predetermined voltage is applied to the electrode 17 by the variable voltage source 19 illustrated in FIG. 7 and then the current value at that time is measured. This allows calculating the resistance value by the NMOS transistors (301-1 to 301-*n*) constituting the replica ODT circuit 30. When a preferred resistance value is obtained, the combination of the NMOS transistors (301-1 to 301-*n*) turned on in the replica ODT circuit 30 can be used as the combination of the NMOS transistors to be turned on among the NMOS transistors (101-1 to 101-*n*) of the ODT circuit 10.

Similarly, in the case where the resistance value by the PMOS transistors (300-1 to 300-*n*) constituting the replica ODT circuit 30 is measured, the respective NMOS transistors (301-1 to 301-*n*) of the replica ODT component circuits (30-1 to 30-*n*) are turned off by the control signals (NTEST1 to NTESTn) from the control circuit 40. On the other hand, the first power supply voltage VCCQ is applied to the drain electrodes of the PMOS transistors (300-1 to 300-*n*) so as to selectively turn on the respective PMOS transistors (300-1 to 300-*n*) of the replica ODT component circuits (30-1 to 30-*n*) by the control signals (PTEST1 to PTESTn) from the control circuit 40. Measuring the current value at that time allows calculating the resistance value by the PMOS transistors (300-1 to 300-*n*) constituting the replica ODT circuit 30. When a preferred resistance value is obtained, the combination of the PMOS transistors (300-1 to 300-*n*) turned on in the replica ODT circuit 30 can be used as the combination of the PMOS transistors to be turned on among the PMOS transistors (100-1 to 100-*n*) of the ODT circuit 10.

For example, for the configuration where the gate widths of the MOS transistors constituting the replica ODT circuit 30 are shrunk to half of the respective gate widths of the MOS transistors constituting the ODT circuit 10, when 600Ω is obtained by the replica ODT circuit 30, reproducing the combination of the MOS transistors turned on in the replica ODT circuit 30 by the ODT circuit 10 allows obtaining the resistance value of 300Ω by the ODT circuit 10.

With this embodiment, disposing the replica ODT circuit 30 obtained by, for example, shrinking the ODT circuit 10 by the predetermined ratio provides the semiconductor integrated device that allows efficiently adjusting the resistance of the ODT circuit 10 without causing a significant increase in chip size of the semiconductor substrate 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated device, comprising:
   a first node configured to receive a first voltage;
   a second node configured to receive a second voltage;
   an Input/Output (I/O) pad configured to output an output signal of the semiconductor integrated device and to receive a signal from an outside of the semiconductor integrated device;
   a first PMOS transistor that has a source-drain path between the first node and the I/O pad, wherein the first PMOS transistor connects the first node to the I/O pad when being turned on;
   a first NMOS transistor that has a source-drain path between the second node and the I/O pad, wherein the first NMOS transistor connects the second node to the I/O pad when being turned on; and
   a control circuit configured to supply a control signal to a gate electrode of the first PMOS transistor and a gate electrode of the first NMOS transistor, wherein
   the control circuit supplies a control signal at a third voltage lower than the second voltage to the gate electrode of the first PMOS transistor when turning on the first PMOS transistor, and supplies a control signal at a fourth voltage higher than the first voltage to the gate electrode of the first NMOS transistor when turning on the first NMOS transistor;
   the semiconductor integrated device further comprising an output buffer, a first signal supplying circuit, and a second signal supplying circuit, wherein
   the output buffer comprises,
     a second PMOS transistor coupled in parallel to the first PMOS transistor, wherein the second PMOS transistor is configured to supply the output signal to the I/O pad when being turned on, and
     a second NMOS transistor coupled in parallel to the first NMOS transistor, wherein the second NMOS transistor is configured to supply the output signal to the I/O pad when being turned on,
   the first signal supplying circuit is configured to supply a first signal to a gate electrode of the second PMOS transistor,
   the second signal supplying circuit is configured to supply a second signal to a gate electrode of the second NMOS transistor, and
   the second PMOS transistor supplies the output signal in response to the first signal and the second NMOS transistor supplies the output signal in response to the second signal.

2. The semiconductor integrated device according to claim 1, further comprising:
   a plurality of PMOS transistors coupled in parallel to the first PMOS transistor, the plurality of PMOS transistors having a source-drain path coupled between the first node and the electrode; and
   a plurality of NMOS transistors coupled in parallel to the first NMOS transistor, the plurality of NMOS transistors having a source-drain path coupled between the second node and the electrode, wherein
   the control circuit is configured to supply a control signal to gate electrodes of the plurality of PMOS transistors and gate electrodes of the plurality of NMOS transistors.

3. The semiconductor integrated device according to claim 2, wherein
   gate widths of the plurality of PMOS transistors and the plurality of NMOS transistors have respective sizes adjusted by a predetermined ratio (excluding one).

4. The semiconductor integrated device according to claim 3, wherein
   the predetermined ratio is set using a multiplier of two.

5. The semiconductor integrated device according to claim 1, further comprising:
   a plurality of PMOS transistors coupled in parallel to the first PMOS transistor, the plurality of PMOS transistors having a source-drain path coupled between the first node and the electrode; and a plurality of NMOS transistors coupled in parallel to the first NMOS transistor, the plurality of NMOS transistors having a source-drain path coupled between the second node and the electrode, wherein the control circuit is configured to supply a control signal to gate electrodes of the plurality of PMOS transistors and gate electrodes of the plurality of NMOS transistors.

6. The semiconductor integrated device according to claim 5, wherein gate widths of the plurality of PMOS transistors and the plurality of NMOS transistors have respective sizes adjusted by a predetermined ratio (excluding one).

7. The semiconductor integrated device according to claim 6, wherein the predetermined ratio is set using a multiplier of two.

8. The semiconductor integrated device according to claim 7, further comprising a voltage generation circuit, wherein the fourth voltage is generated using the first voltage input to the voltage generation circuit.

* * * * *